(12) United States Patent
Raimondi et al.

(10) Patent No.: US 9,929,706 B2
(45) Date of Patent: Mar. 27, 2018

(54) CLASS D SWITCHING AMPLIFIER AND METHOD OF CONTROLLING A LOUDSPEAKER

(71) Applicant: STMicroelectronics S.r.l., Agrate Brianza (IT)

(72) Inventors: Marco Raimondi, Busto Garolfo (IT); Edoardo Botti, Vigevano (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/497,313

(22) Filed: Apr. 26, 2017

(65) Prior Publication Data
US 2017/0230020 A1 Aug. 10, 2017

Related U.S. Application Data

(63) Continuation of application No. 14/797,934, filed on Jul. 13, 2015, now Pat. No. 9,660,586.

(30) Foreign Application Priority Data

Aug. 8, 2014 (IT) .............................. TO2014A0650

(51) Int. Cl.
*H03F 3/38* (2006.01)
*H03F 3/45* (2006.01)
(Continued)

(52) U.S. Cl.
CPC ......... *H03F 3/45932* (2013.01); *H03F 3/185* (2013.01); *H03F 3/2173* (2013.01);
(Continued)

(58) Field of Classification Search
CPC ....................................................... H03F 3/38
(Continued)

(56) References Cited

U.S. PATENT DOCUMENTS 4,918,399 A 4/1990 Devecchi et al.
6,121,818 A 9/2000 Kim et al.
(Continued)

FOREIGN PATENT DOCUMENTS

EP 2048896 A1 4/2009
KR 100796319 B1 1/2008

OTHER PUBLICATIONS

Lu, J. et al., "A Self Oscillating Class D Audio Amplifier with 0.0012% THD+N and 116.5 dB Dynamic Range," Custom Integrated Circuits Conference (CICC), 2010 IEEE XP031786855, Sep. 19, 2010, 5 pages.
(Continued)

*Primary Examiner* — Henry Choe
(74) *Attorney, Agent, or Firm* — Slater Matsil, LLP

(57) ABSTRACT

A switching amplifier includes a first half-bridge PWM modulator, a second half-bridge PWM modulator, and at least one amplifier stage configured to receive input signals. The switching amplifier also includes a PWM control stage configured to control switching of the first PWM modulator and of the second PWM modulator as a function of the input signals, by respective first PWM control signals and second PWM control signals. The amplifier stage and the PWM control stage have a fully differential structure.

20 Claims, 8 Drawing Sheets

(51) Int. Cl.
*H03F 3/185* (2006.01)
*H03F 3/217* (2006.01)

(52) U.S. Cl.
CPC .... *H03F 2200/03* (2013.01); *H03F 2200/171* (2013.01); *H03F 2200/258* (2013.01); *H03F 2200/351* (2013.01); *H03F 2200/78* (2013.01)

(58) Field of Classification Search
USPC .......................................... 330/10, 258, 260
See application file for complete search history.

(56) References Cited

U.S. PATENT DOCUMENTS

| | | | |
|---|---|---|---|
| 6,307,431 B1 | 10/2001 | Botti et al. | |
| 7,142,050 B2 | 11/2006 | Risbo | |
| 7,463,089 B1 | 12/2008 | Adduci et al. | |
| 7,541,869 B2 | 6/2009 | Adduci et al. | |
| 7,733,170 B2 | 6/2010 | Cheng | |
| 7,834,696 B2 | 11/2010 | Giotta et al. | |
| 7,948,313 B2 | 5/2011 | Tsuji et al. | |
| 8,502,602 B2 * | 8/2013 | Hirano | H03F 3/217 330/10 |
| 8,847,677 B2 * | 9/2014 | Nagashima | H03F 3/45475 330/10 |
| 8,866,544 B2 * | 10/2014 | Llewellyn | H03F 3/217 330/10 |
| 2007/0229159 A1 | 10/2007 | Kirshnan et al. | |
| 2008/0272842 A1 | 11/2008 | Lee et al. | |
| 2011/0169569 A1 | 7/2011 | Liu | |
| 2013/0033319 A1 | 2/2013 | Chen et al. | |

OTHER PUBLICATIONS

Samala, S. et al., "45nm CMOS 8I CR Class-D Audio Driver with 79% Efficiency and 100dB SNR," Solid-State Circuits Conference Digest of Technical Papers (ISSCC). 2010 IEEE International, IEEE Piscataway, NJ, USA, Feb. 76, 2010, XP031650120, pp. 86-87.

* cited by examiner

CLASS D SWITCHING AMPLIFIER AND METHOD OF CONTROLLING A LOUDSPEAKER

CROSS-REFERENCE TO RELATED APPLICATIONS

This application is a continuation of U.S. patent application Ser. No. 14/797,934, filed on Jul. 13, 2015, which application claims the benefit of Italian Application No. TO2014A000650, filed on Aug. 8, 2014, which application is hereby incorporated herein by reference.

TECHNICAL FIELD

The present disclosure relates to a class D switching amplifier and to a method of controlling a loudspeaker for use in audio applications.

BACKGROUND

As is known, some widespread types of amplifiers, for example class D audio amplifiers, exploit full-bridge converter stages in order to maximize the dynamics of the output voltages that may be supplied to the load, maintaining high efficiency.

A full-bridge converter stage of an audio amplifier is based upon two half-bridge circuits, which may be controlled separately, albeit in a coordinated way, by respective distinct driving stages. This type of technology affords in fact a satisfactory flexibility of use. For instance, it is possible to implement pulse width modulation (PWM) techniques, both in phase and in phase opposition.

The driving stages have the same structure and receive at input signals in phase opposition that are used for controlling the respective half-bridge circuits symmetrically.

A limit of known amplifiers that are based upon independent driving stages is represented by the rejection of common-mode disturbance.

Possible defects of symmetry of the two driving stages may easily lead to unbalancing that affects the rejection of supply disturbance and cause so-called "crosstalk" phenomena.

Furthermore, known structures suffer from a certain sensitivity to high-frequency noise, which is typical of analog-to-digital converters of a sigma-delta type, which are frequently used upstream of the stages for driving the final power stages.

Known technology for overcoming the sensitivity to high-frequency disturbance lead on the other hand to an increase in the number of components and, consequently, in the complexity of the amplifiers.

SUMMARY

A switching amplifier includes a first half-bridge PWM modulator, a second half-bridge PWM modulator, and at least one amplifier stage configured to receive input signals. The switching amplifier also includes a PWM control stage configured to control switching of the first PWM modulator and of the second PWM modulator as a function of the input signals, by respective first PWM control signals and second PWM control signals. The amplifier stage and the PWM control stage have a fully differential structure.

BRIEF DESCRIPTION OF THE DRAWINGS

For a better understanding of the invention, some embodiments thereof will now be described purely by way of non-limiting example with reference to the attached drawings, wherein.

DETAILED DESCRIPTION OF ILLUSTRATIVE EMBODIMENTS

Figure 1:
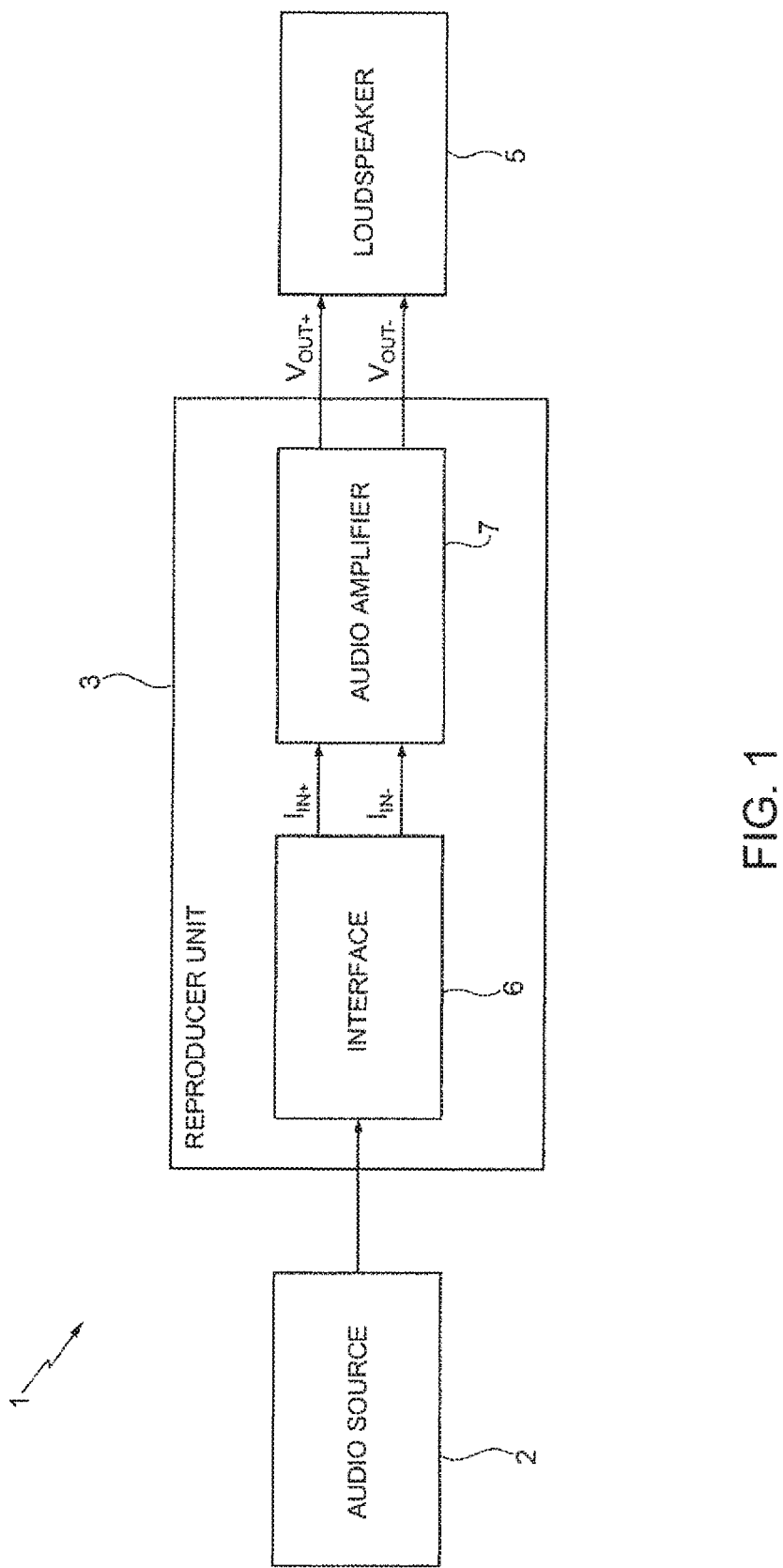
FIG. 1 is a simplified block diagram of an audio system according to the invention.

With reference to FIG. 1, an audio system designated as a whole by the number 1 comprises a signal source 2, a reproducer unit 3 and at least one loudspeaker 5.

The signal source 2 is configured to supply audio signals SA. It may, for example, but not exclusively, be a tuner, a stereo or "home theater" system, a cellphone or a reproducer of audio files, such as a module for reproducing audio files incorporated in a smartphone, a tablet, a portable computer, or a personal computer.

The reproducer unit 3 comprises an interface 6, coupled to the signal source 2 and configured to convert the audio signals SA into corresponding input signals $I_{IN+}$, $I_{IN-}$ and an audio amplifier 7, configured to drive the loudspeaker 5 by output signals $V_{OUT+}$, $V_{OUT-}$ as a function of the input signals $I_{IN+}$, $I_{IN-}$.

In one embodiment, the input signals $I_{IN+}$, $I_{IN-}$ and the output signals $V_{OUT+}$, $V_{OUT-}$ are differential signals, for example, respectively, differential currents and differential voltages.

The loudspeaker 5 may, for example, be an element of a set of loudspeakers or an ear-piece of an earphone set.

Figure 2:
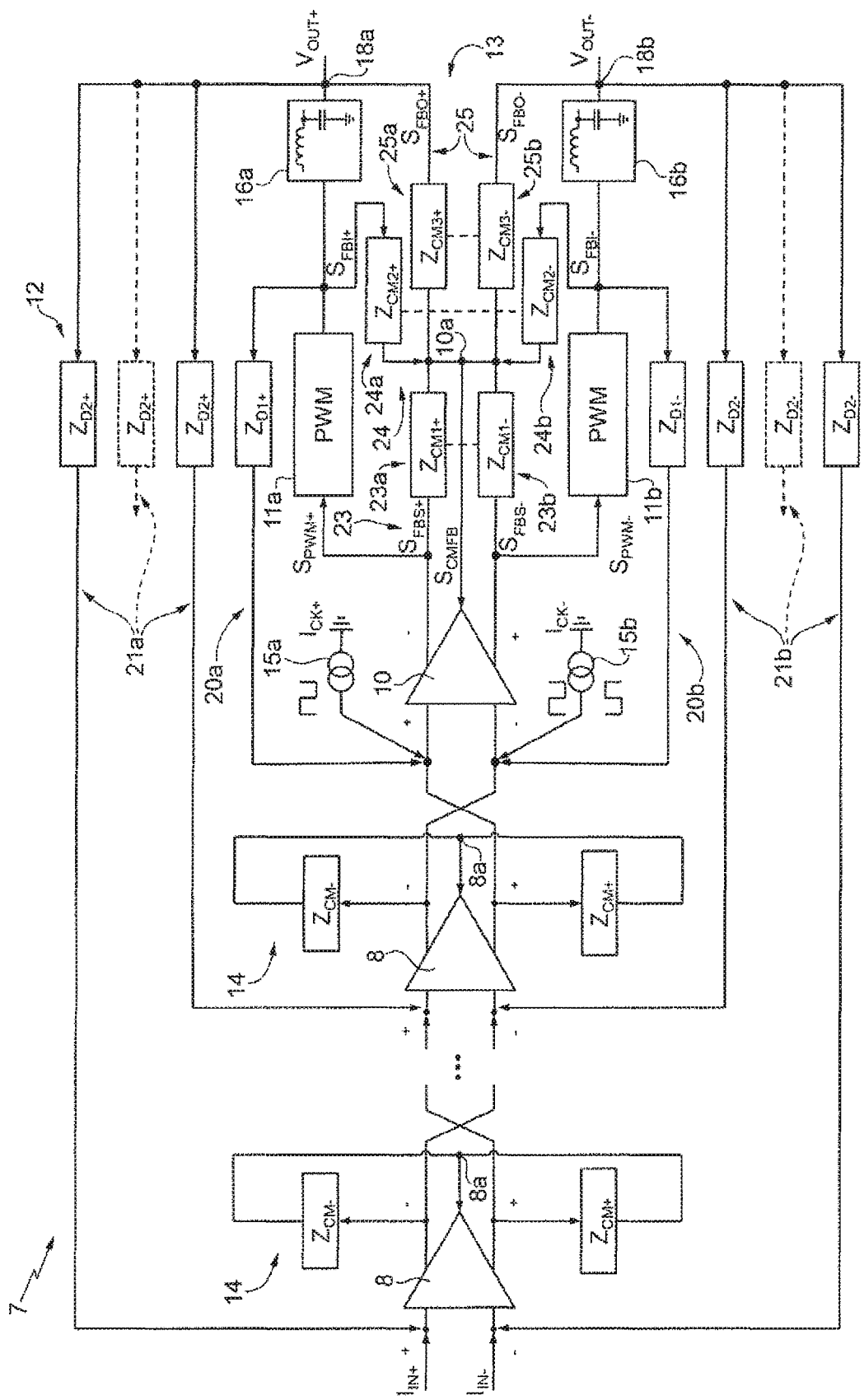
FIG. 2 is a more detailed block diagram of a switching amplifier according to one embodiment of the present invention, incorporated in the audio system of FIG. 1.

In one embodiment, the audio amplifier 7 has the structure illustrated in a simplified way in FIG. 2. The audio amplifier 7 is a class D switching amplifier, uses two PWM modulators each based upon a MOSFET half-bridge and has a structure with nested feedback control loops. In greater detail, the audio amplifier 7 comprises a cascaded chain of amplifier stages 8, a PWM control stage 10, a first PWM modulator 11a, a second PWM modulator 11b, a differential feedback-control network 12 and a common-mode feedback-control network 13.

The amplifier stages 8, which in FIG. 2 are represented in a simplified way, are of a fully differential type. By convention, it will be understood hereinafter that each fully differential stage or structure has a positive input, a negative input, a positive output, a negative output and a common-mode control network. In particular, the terms "positive" and "negative" are herein to be understood in the sense that a variation to the positive input produces a variation of the same sign on the positive output and a variation of an opposite sign on the negative output. A variation to the negative input produces a variation of the same sign on the negative output and a variation of an opposite sign on the positive output. It is evident that the terms "positive" and "negative" may be exchanged. Furthermore, each fully differential stage or structure has a common-mode control terminal.

The first amplifier stage 8 of the series is coupled to the interface 6 (not illustrated in FIG. 2) for receiving the input signals $I_{IN+}$, $I_{IN-}$. Furthermore, each differential stage 8 has the positive output and the negative output coupled to the positive input and to the negative input of the next amplifier stage 8, respectively.

The last amplifier stage 8 of the series has the positive output and the negative output coupled, respectively, to the positive input and to the negative input of the PWM control stage 10, which has a fully differential structure and is also represented in a simplified way in FIG. 2.

The amplifier stages 8 are further provided with common-mode control networks 14, between the respective outputs and a respective common-mode control terminal 8a. The common-mode control networks 14 have respective impedances $Z_{CM+}$, $Z_{CM-}$ that may be the same as one another or different, according to the requirements.

As well as being coupled to the outputs of the last amplifier stage 8 of the series, the positive input and the negative input of the PWM control stage 10 are coupled, respectively, to a first reference generator 15a, for receiving a first reference signal $I_{CK+}$ and to a second reference generator 15b, for receiving a second reference signal $I_{CK-}$. In one embodiment, the reference signals $I_{CK+}$, $I_{CK-}$ are square-wave currents that have a switching frequency and are integrated by the PWM control stage 10. In a different embodiment (not illustrated), the reference signals may be sawtooth voltages with a frequency equal to the switching frequency supplied directly to the first PWM modulator 11a and to the second PWM modulator 11b, respectively. Furthermore, the reference signals $I_{CK+}$, $I_{CK-}$ (whether square-wave or sawtooth) may be supplied in phase opposition for carrying out a modulation of an out-of-phase type, or else in phase, for carrying out a modulation of an in-phase type.

The negative output and the positive output of the PWM control stage 10 are coupled, respectively, to the first PWM modulator 11a and to the second PWM modulator 11b and supply, respectively, a first PWM control signal $S_{PWM+}$ and a second PWM control signal $S_{PWM-}$. The first PWM control signal $S_{PWM+}$ and the second PWM control signal $S_{PWM-}$ cause switching, respectively, of the first PWM modulator 11a and of the second PWM modulator 11b at the frequency of the reference signals $I_{CK+}$, $I_{CK-}$ and with a duty cycle that is a function of the input signals $I_{IN+}$, $I_{IN-}$.

A first output filter 16a is connected between an output of the first PWM modulator 11a and a first output terminal 18a and comprises a first LC network. A second output filter 16b is coupled between an output of the second PWM modulator 11b and a second output terminal 18b and comprises a second LC network. The loudspeaker 5 is coupled between the outputs 18a, 18b and defines a load of the audio amplifier 7.

The differential feedback-control network 12 has: a feedback branch 20a, having an impedance $Z_{D1+}$, which picks up a feedback signal from the output of the first PWM modulator 11a (upstream of the first output filter 16a) and is coupled to the positive input of the PWM control stage 10; a feedback branch 20b, having an impedance $Z_{D1-}$, which picks up a feedback signal from the output of the second PWM modulator 11b (upstream of the second output filter 16b) and is coupled to the negative input of the PWM control stage 10; a plurality of feedback branches 21a, which have respective impedances $Z_{D2+}$ and are coupled to the first output terminal 18a (downstream of the first output filter 16a) and each to the positive input of a respective amplifier stage 8; and a plurality of feedback branches 21b, which have respective impedances $Z_{D2-}$ and are coupled to the second output terminal 18b, (downstream of the second output filter 16b) and each to the negative input of a respective amplifier stage 8.

The differential feedback-control network 12 thus provides a nested feedback-loop structure.

The common-mode feedback-control network 13 includes the first PWM modulator 11a and the second PWM modulator 11b and is configured to pick up feedback signals between the outputs of the PWM control stage 10 and the output terminals 18a, 18b and to supply a common-mode control signal $S_{CMFB}$ to a common-mode control terminal 10a of the PWM control stage 10, for maintaining a common-mode voltage of the PWM control stage 10 substantially constant.

In one embodiment, the common-mode feedback-control network 13 comprises a clipping control loop 23, an inner control loop 24 and an outer control loop 25.

The clipping control loop 23 has: a branch 23a, having an impedance $Z_{CM1+}$, between the negative output of the PWM control stage 10 and its common-mode control terminal 10a; and a branch 23b, having an impedance $Z_{CM1-}$, between the positive output of the PWM control stage 10 and its common-mode control terminal 10a. The clipping control loop 23 thus picks up clipping feedback signals $S_{FBS+}$, $S_{FBS-}$ upstream of the PWM modulators 11a, 11b.

The inner control loop 24 has: a branch 24a, having an impedance $Z_{CM2+}$, between the output of the first PWM modulator 11a and the common-mode control terminal 10a of the PWM control stage 10; and a branch 24b, having an impedance $Z_{CM2-}$, between the output of the second PWM modulator 11b and the common-mode control terminal 10a. The inner control loop 24 is thus internal to the output filters 16a, 16b and picks up inner clipping feedback signals $S_{FBI+}$, $S_{FBI-}$ downstream of the PWM modulators 11a, 11b.

The outer control loop 25 has: a branch 25a, having an impedance $Z_{CM3+}$, between the first output terminal 18a and the common-mode control terminal 10a; and a branch 25b, having an impedance $Z_{CM3-}$, between the second output terminal 18b and the common-mode control terminal 10a. The outer control loop 25 is thus external to the output filters 16a, 16b and picks up outer clipping feedback signals $S_{FBO+}$, $S_{FBO-}$ downstream both of the PWM modulators 11a, 11b and of the output filters 16a, 16b.

In the embodiment described and illustrated in FIG. 2, the clipping feedback signals $S_{FBS+}$, $S_{FBS-}$ coincide with the PWM control signals $S_{PWM+}$, $S_{PWM-}$, the inner clipping feedback signals $S_{FBI+}$, $S_{FBI-}$ coincide with the signals supplied by the PWM modulators 11a, 11b and the outer clipping feedback signals $S_{FBO+}$, $S_{FBO-}$ coincide with the output signals $V_{OUT+}$, $V_{OUT-}$.

In FIG. 2, possible connections between the branch 23a and the branch 23b, between the branch 24a and the branch 24b and between the branch 25a and the branch 25b are represented schematically by dashed lines.

Consequently, the clipping control loop 23 picks up its own feedback signals between the PWM control stage 10 and the PWM modulators 11a, 11b. The inner control loop 24 and the outer control loop 25 pick up the respective feedback signals, respectively, upstream and downstream of the output filters 16a, 16b.

Figure 3:
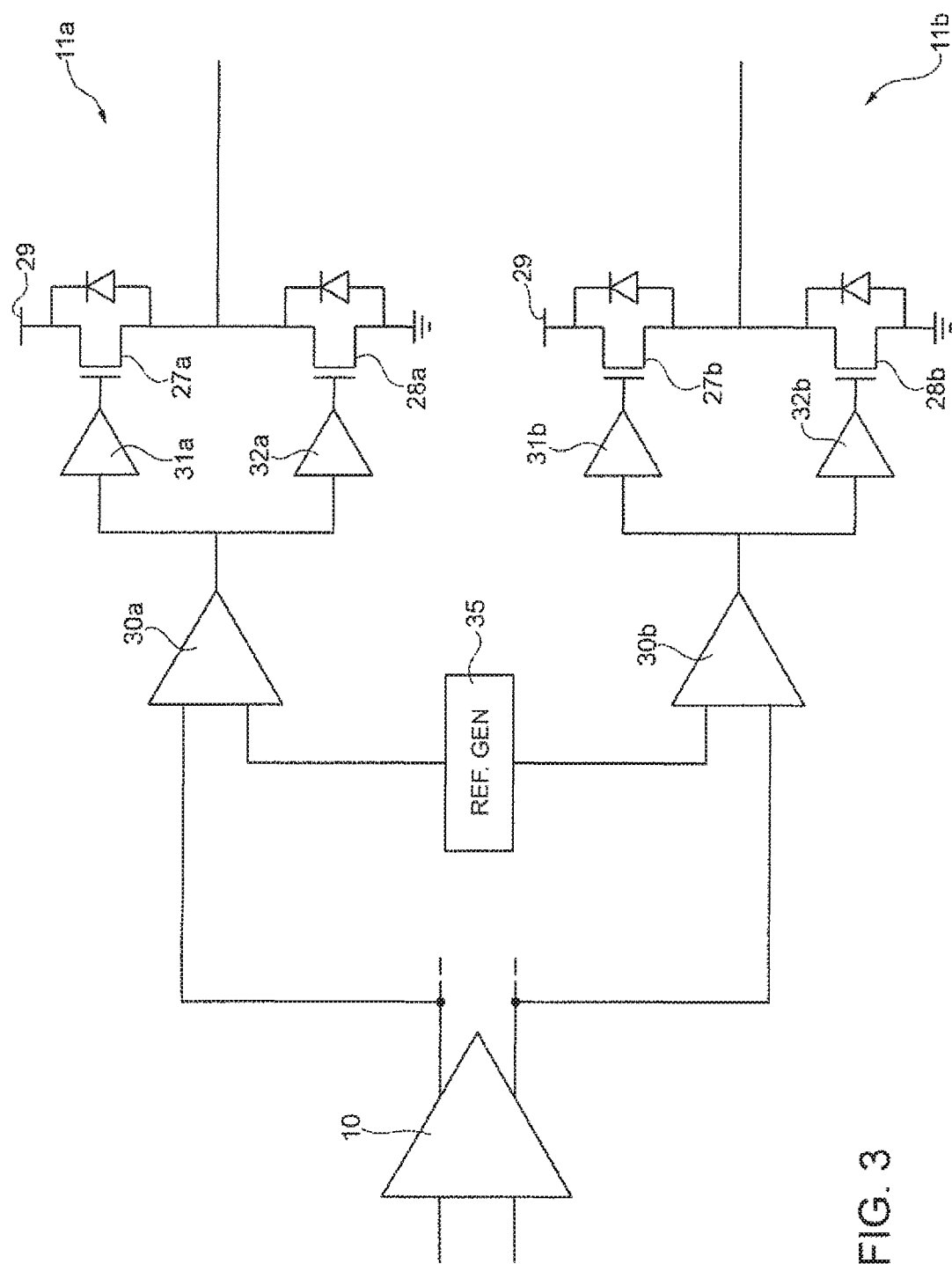
FIG. 3 is a more detailed block diagram of a first component of the switching amplifier of FIG. 2.

The first PWM modulator 11a and the second PWM modulator 11b are of the half-bridge type and are driven separately, respectively, by the negative output and the positive output of the PWM control stage 10. As illustrated in FIG. 3, the first PWM modulator 11a and the second PWM modulator 11b each comprise: a comparator stage 30a (30b), for example a threshold comparator, possibly with hysteresis; and two switches 27a, 28a (27b, 28b), which are defined by respective MOS transistors and are arranged in series between a supply line 29 and ground and are controlled by the comparator stage 30a (30b) through respective driving circuits 31a, 32a (31b, 32b). The comparator stages 30a, 30b have first inputs coupled, respectively, to the negative output and to the positive output of the PWM control stage 10 and second inputs coupled to a reference generator 35, which supplies a constant reference signal. In one embodiment (not illustrated), the reference generator may supply a sawtooth or triangular reference signal. In this case, the reference generators 15a, 15b may be omitted.

As already noted (FIG. 2), the first PWM modulator 11a and the second PWM modulator 11b are included in the control loops of the common mode of the PWM control stage 10 provided by the common-mode feedback-control network 13.

The fully differential structure of the amplifier stages 8 and of the PWM control stage 10 enables substantial limitation of the possible defects of symmetry, avoiding any unbalancing that might affect rejection of disturbance. Furthermore, thanks to the fully differential structure, maintenance of the sign at each step of the chain of amplifier stages 8 is obtained simply by coupling the positive and negative outputs of one stage to the positive and negative inputs, respectively, of the next stage. There is thus the advantage of a reduced sensitivity to high-frequency disturbance, typical of inverting configurations, without any need to use purposely provided inversion stages for obtaining the correct sign, with benefit in terms of number of components, complexity of construction, area occupied and, ultimately, costs.

The common-mode feedback-control network 13 generally allows to set the common mode of the PWM control stage lo effectively, enabling, among other things, both to use an in-phase modulation scheme, if desired, and to implement diagnostic techniques that envisage operation in single-ended mode (this aspect will be taken up in greater detail in what follows).

Furthermore, the innermost clipping control loop 23 enables stable maintenance of the common mode also when the input signals $I_{IN+}$, $I_{IN-}$ cause clipping of the PWM modulators 11a, 11b (in practice, the duty cycle is constantly forced to 100% or 0%, exhausting the available margin). In this eventuality, the control loops that pick up the feedback signals downstream of the PWM modulators 11a, 11b are ineffective because the respective feedback signals remain unchanged despite variations of the input signals $I_{IN+}$, $I_{IN-}$ and, within given intervals, also of the outputs of the PWM control stage 10. In the absence of common-mode control, the common-mode offsets may cause drift of the control signals and exit from the clipping condition of one of the PWM modulators 11a, 11b (according to the sign of the offsets), reducing the maximum output power available. In general, operation of the audio amplifier would present anomalies.

The clipping control loop 23, instead, continues to operate properly up to saturation of the PWM control stage 10 and thus with an available swing that is wider than in clipping conditions. The common-mode control of the PWM control stage 10 is thus effective and all the power available may be properly supplied.

The outer control loop 25 picks up its feedback signals downstream of the output filters 16a, 16b, which are thus included in the common-mode control structure. The outer control loop 25 thus enables damping of the common-mode resonance of the output filters 16a, 16b, whereas the differential-mode resonance is attenuated by the differential feedback-control network 12, as well as by the load present between the output terminals 18a, 18b (in this case, the loudspeaker 5).

Figure 4:
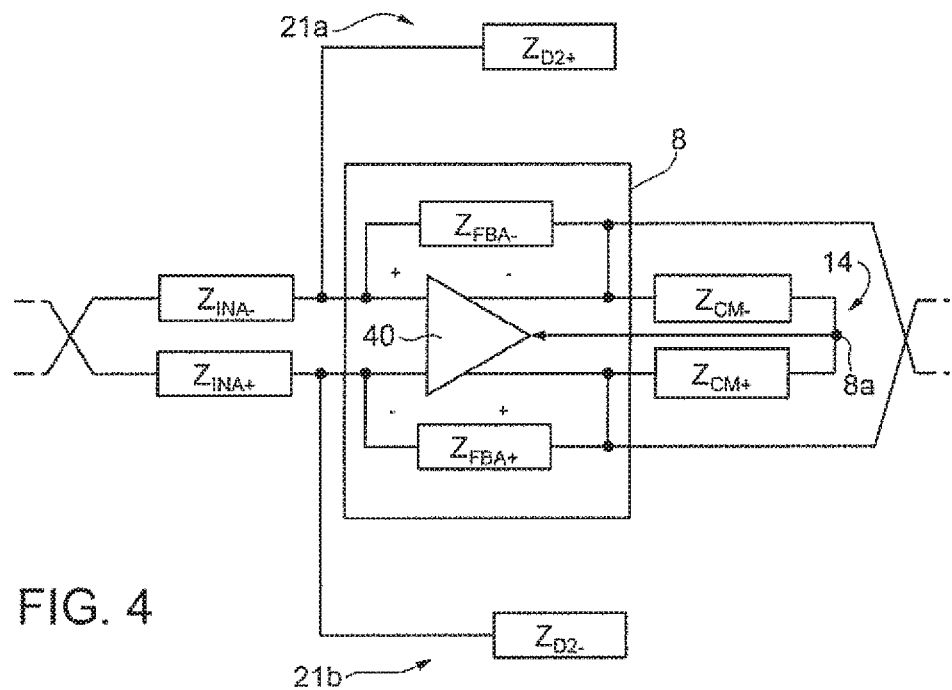
FIG. 4 is a more detailed block diagram of a second component of the switching amplifier of FIG. 2.

In one embodiment, the amplifier stages 8 have the structure illustrated in FIG. 4. FIG. 4 shows, by way of example, a single amplifier stage 8. It is, however, understood that what is described hereinafter applies to all the amplifier stages 8 present. In particular, each amplifier stage 8 comprises a fully differential amplifier 40 provided with feedback impedances $Z_{FBA+}$, $Z_{FBA-}$. Input impedances $TI_{NA+}$, $TI_{NA-}$ (not illustrated for simplicity in FIG. 2) are further coupled to the positive and negative inputs of the fully differential amplifier 40. The positive and negative inputs of the fully differential amplifier 40 define, respectively, the positive and negative inputs of the amplifier stage 8. The input impedances $T_{INA+}$, $TI_{NA-}$, which are arranged in series to respective inputs of the fully differential amplifier 40, for simplicity are not represented in the simplified diagram of FIG. 2. It is understood in any case that the positive and negative outputs of each amplifier stage 8 are coupled, respectively, to the positive and negative inputs of the next amplifier stage 8 of the chain through the input impedances $TI_{NA-}$, $TI_{NA+}$ of the latter. The feedback branches 21a, 21b of the differential feedback-control network 12 are coupled to the positive and negative inputs, respectively, of the fully differential amplifier 40. The feedback impedances $Z_{FBA+}$, $Z_{FBA-}$ are arranged the first between the negative input and the positive output and the second between the positive input and the negative output. The outputs and the common-mode control terminal 8a of the amplifier stage 8 are defined, respectively, by the outputs and by a common-mode control terminal of the fully differential amplifier 40.

Figure 5:
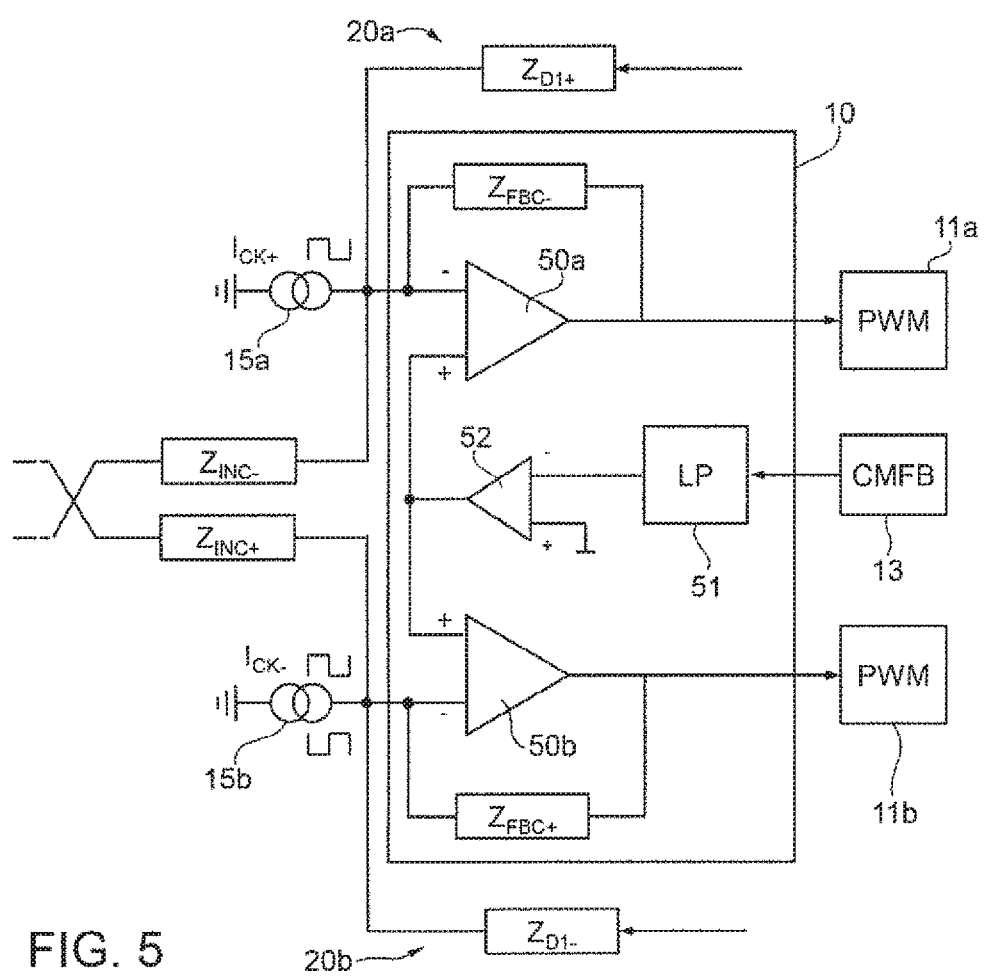
FIG. 5 is a more detailed block diagram of a third component of the switching amplifier of FIG. 2.

FIG. 5 illustrates the structure of the PWM control stage 10 in one embodiment. The PWM control stage 10 comprises a first control amplifier 50a, a second control amplifier 50b, input impedances $TI_{NC+}$, $TI_{NC-}$, feedback impedances $Z_{FBC+}$, $Z_{FBC-}$, a low-pass filter 51 and an error amplifier 52.

The first control amplifier 50a and the second control amplifier 50b are of the single-terminal type and are coupled symmetrically between the positive and negative inputs and the positive and negative outputs for forming a fully differential structure. More precisely, the input impedances $TI_{NC-}$, $TI_{NC+}$ are coupled in series to first inputs of the same type (for example, inverting inputs), respectively, of the first control amplifier 50a and of the second control amplifier 50b, which have the feedback impedances $Z_{FBC+}$, $Z_{FBC-}$ coupled between the same inputs and the respective outputs. The outputs of the first control amplifier 50a and of the second control amplifier 50b define, respectively, the negative output and the positive output of the PWM control stage

10. The square-wave reference signals $I_{CK+}$, $I_{CK-}$ are injected, respectively, at input to the first control amplifier 50a and the second control amplifier 50b.

The low-pass filter 51 has an input that defines the common-mode control terminal 10a of the PWM control stage 10 and an output coupled to an input of the error amplifier 52. The error amplifier 52 has a further input, which receives a common-mode reference signal and an output coupled to second inputs of the same type (for example, non-inverting inputs) of the first control amplifier 50a and of the second control amplifier 50b, respectively.

The low-pass filter 51 has a cutoff frequency lower than the switching frequency of the reference signals $I_{CK+}$, $I_{CK-}$, for example by at least one decade, and limits the band of the feedback loops defined by the common-mode feedback-control network 13. By virtue of the feedback impedances $Z_{FBC+}$, $Z_{FBC-}$, the inverting inputs of the control amplifiers 50a, 50b are kept at the same voltage as the corresponding non-inverting inputs when the reference signals $I_{CK+}$, $I_{CK-}$ are injected. The low-pass filter 51, by limiting the band, prevents the feedback loops defined by the common-mode feedback-control network 13 from reacting to the variations due to oscillations of the reference signals $I_{CK+}$, $I_{CK-}$. In practice, the low-pass filter 51 allows to attenuate and substantially suppress the oscillations at the switching frequency fed back from the common-mode feedback-control network 13 to the common-mode control terminal 10a. The output of the error amplifier 52 and the inputs of the control amplifiers 50a, 50b coupled thereto are not affected by these oscillations and the waveforms on the outputs of the control amplifiers 50a, 50b towards the PWM modulators 11a, 11b are preserved. This enables operation of the audio amplifier 7 both in in-phase mode and in single-terminal mode (for example, to implement functions of diagnostics of the load) albeit using amplification stages and a PWM control stage with a fully differential structure, which would otherwise not be recommended. The audio amplifier described may consequently be used in a flexible way, in addition to enjoying the benefit of the fully differential structure as regards having low sensitivity to disturbance.

As mentioned, the audio amplifier 7 described may be used in single-terminal mode to implement diagnostic functions for the load. For this purpose, a test signal, for example a voltage, is applied to a load present between the output terminals 18a, 18b and the current consequently produced is read, checking whether it remains within a range of values indicating that operation is correct and the load is connected. In class D amplifiers, however, reading of the load current is affected by an error due to the current that flows through the capacitive portion of the LC output filters, in particular if the testing frequency is high. To reduce the reading error, during testing one of the outputs is kept in conditions of rest, i.e., with a substantially zero signal present. The current that flows in the PWM modulator (half-bridge) driven in this way is substantially equal to the current in the load, as described in EP-A-2 048 896, in the name of the present applicant.

Figure 6:
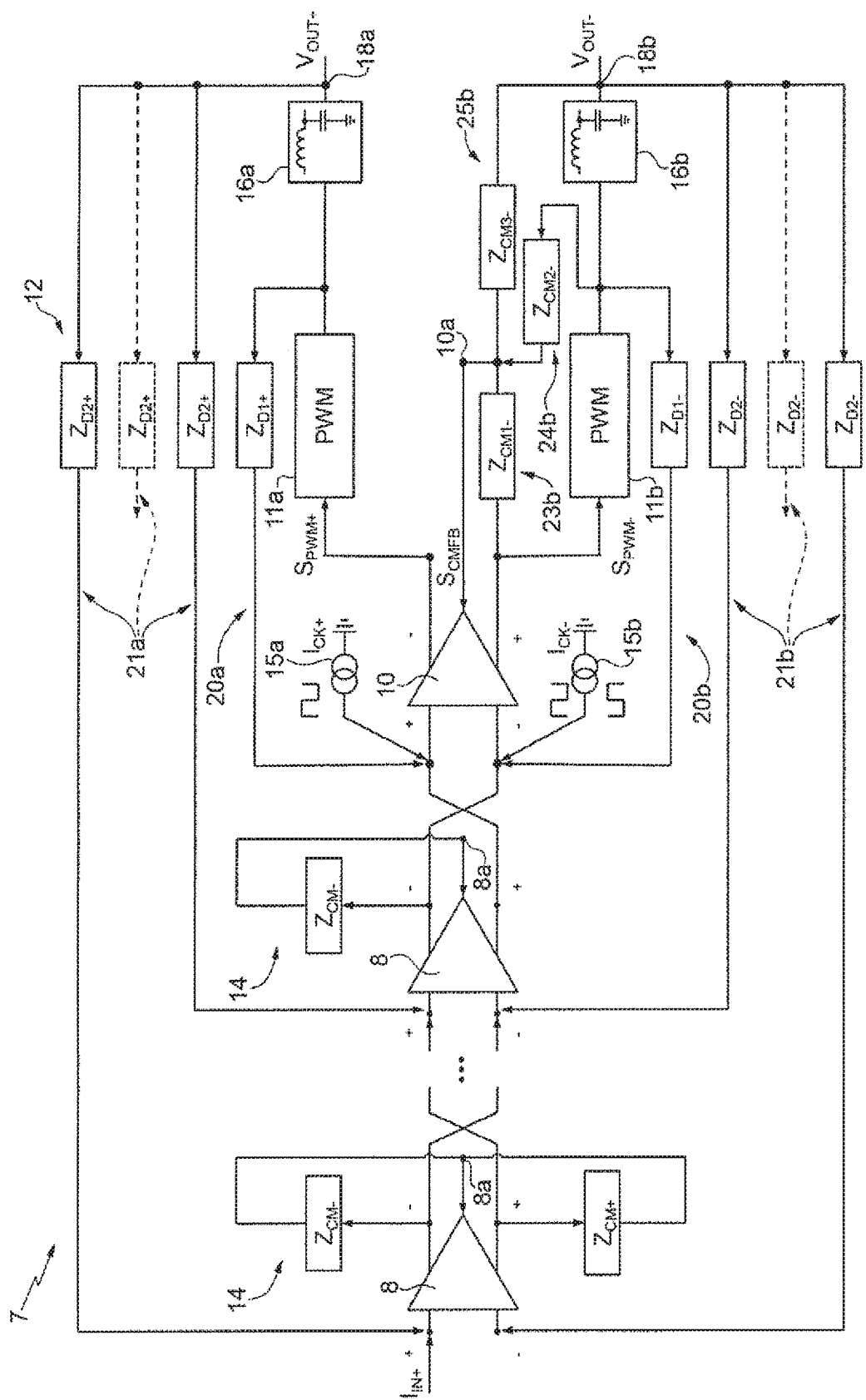
FIG. 6 shows the switching amplifier of FIG. 2 in a different operating configuration.

The operating conditions referred to above may be obtained in the audio amplifier 7 in the way referred to hereinafter, with reference to FIG. 6. The input signal on one of the inputs of the audio amplifier 7 (for example, the input signal $I_{IN-}$) is annulled and the common-mode control on the amplifier stage 8 immediately upstream of the PWM control stage 10 is performed through just one of the outputs, for example the negative output. In practice, a portion of the corresponding common-mode control network 14 (for example, the branch $Z_{CM+}$ corresponding to the positive output) is disabled or excluded. Furthermore, the portion of the common-mode feedback-control network 13 corresponding to one of the outputs of the PWM control stage 10 (for example, the branches 23a, 24a, 25a corresponding to the positive output) is excluded or disabled. In this way, control at the common-mode control terminal 10a is carried out only through the branches 23b, 24b, 25b enabled and the corresponding (negative) output. The voltage offset of this output as a result of the input signal $I_{IN+}$ is reduced, enabling an accurate reading of the current in the load.

Figure 7:
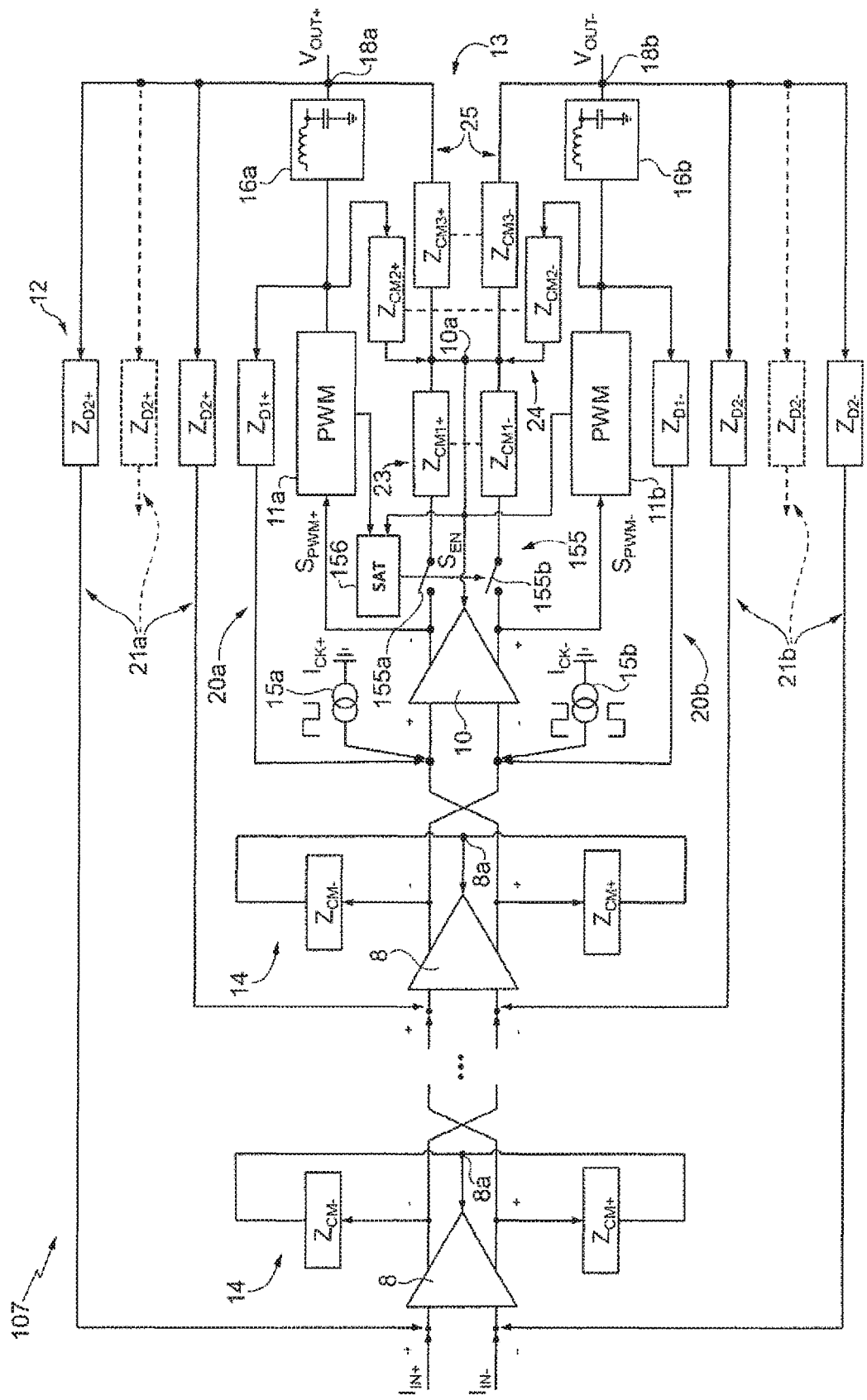
FIG. 7 is a block diagram of the switching amplifier according to a different embodiment of the present invention.

Illustrated in FIG. 7 is a different embodiment. In this case, a class D audio amplifier 107 comprises the chain of amplifier stages 8, the PWM control stage 10, the first PWM modulator 11a, the second PWM modulator 11b, the differential feedback-control network 12 and the common-mode feedback-control network 13 already described with reference to FIGS. 2-6. Furthermore, the audio amplifier 107 comprises a selective-enabling stage 155 and a clipping-detector stage 156. The selective-enabling stage 155 comprises a first switch 155a and a second switch 155b, which are arranged along the branch 23a and along the branch 23b, respectively, of the clipping control loop 23 for enabling and disabling alternatively the clipping control loop 23 as a function of the response of the clipping-detector stage 156. More precisely, the first switch 155a is arranged between the negative output of the PWM control stage 10 and the impedance $Z_{CM1+}$ and the second switch 155b is arranged between the positive output of the PWM control stage 10 and the impedance $Z_{CM1-}$.

The clipping-detector stage 156 has inputs coupled to the first PWM modulator 11a and to the second PWM modulator 11b, respectively and is configured to detect conditions of saturation of one and/or the other, i.e., conditions where the output of the first PWM modulator 11a and/or of the second PWM modulator 11b is given by control signals with maximum duty cycle (for example, 100%). An output of the clipping-detector stage 156 simultaneously controls the first switch 155a and the second switch 155b by an enable signal $S_{EN}$. In conditions of clipping of the first PWM modulator 11a and/or of the second PWM modulator 11b, the clipping-detector stage 156 sets the enable signal $S_{EN}$ to an enabling value, which causes closing of the first switch 155a and of the second switch 155b and enables operation of the clipping control loop 23. Instead, in normal operating conditions of the first PWM modulator 11a and of the second PWM modulator 11b, the clipping-detector stage 156 sets the enable signal $S_{EN}$ to a disabling value, which causes opening of the first switch 155a and of the second switch 155b and inhibits operation of the clipping control loop 23. In this way, the clipping control loop 23 is used exclusively when the remaining portion of the common-mode feedback-control network 13 is not in a condition to guarantee proper common-mode control of the PWM driving stage 10 on account of clipping.

Figure 8:
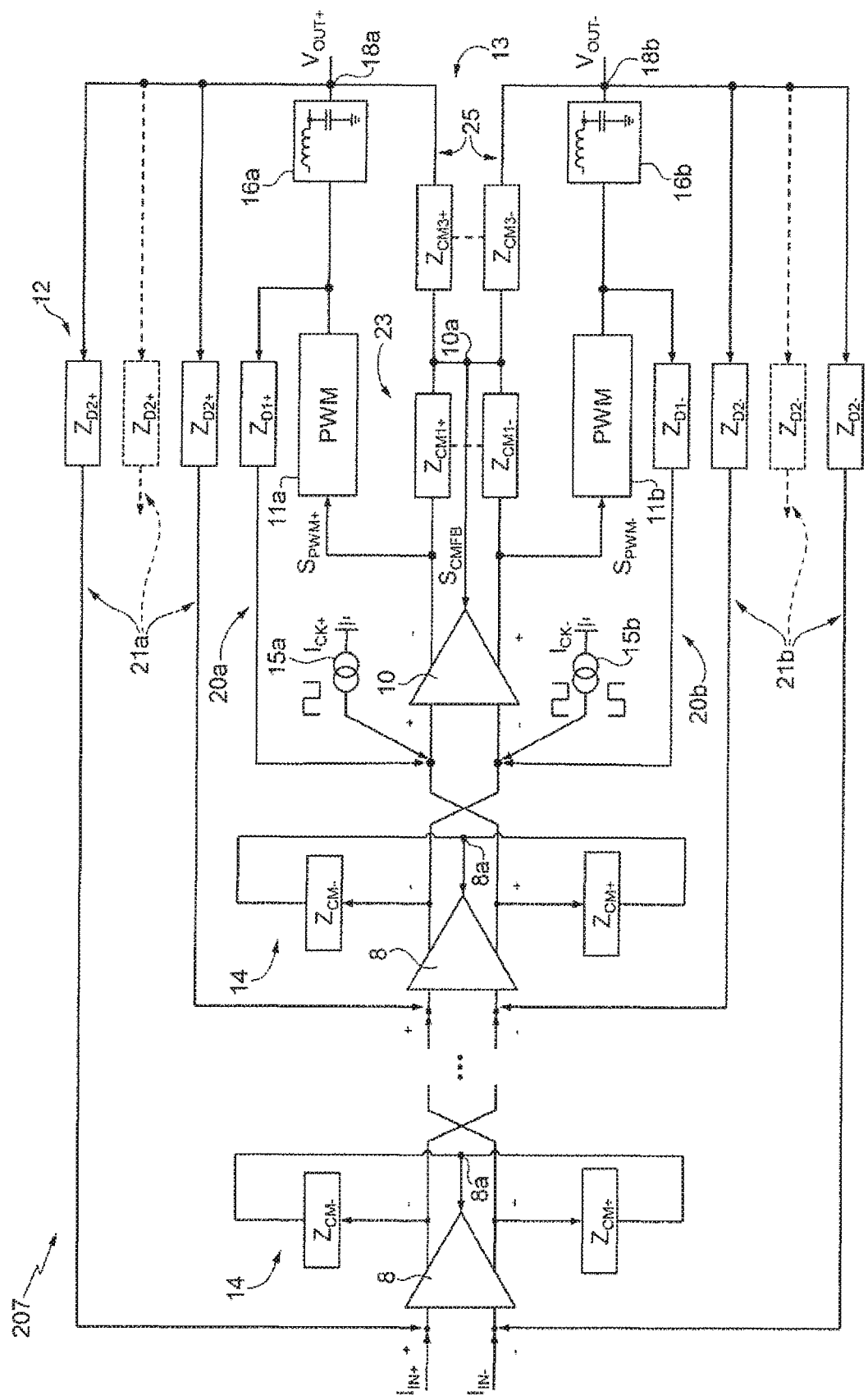
FIG. 8 is a block diagram of the switching amplifier according to a further embodiment of the present invention.

In one embodiment (illustrated in FIG. 8), in an audio amplifier 207 the inner control loop 24 may be missing, for example when the outer control loop 25 has a sufficiently high d.c. gain and is at the same time able to ensure adequate stability.

Figure 9:
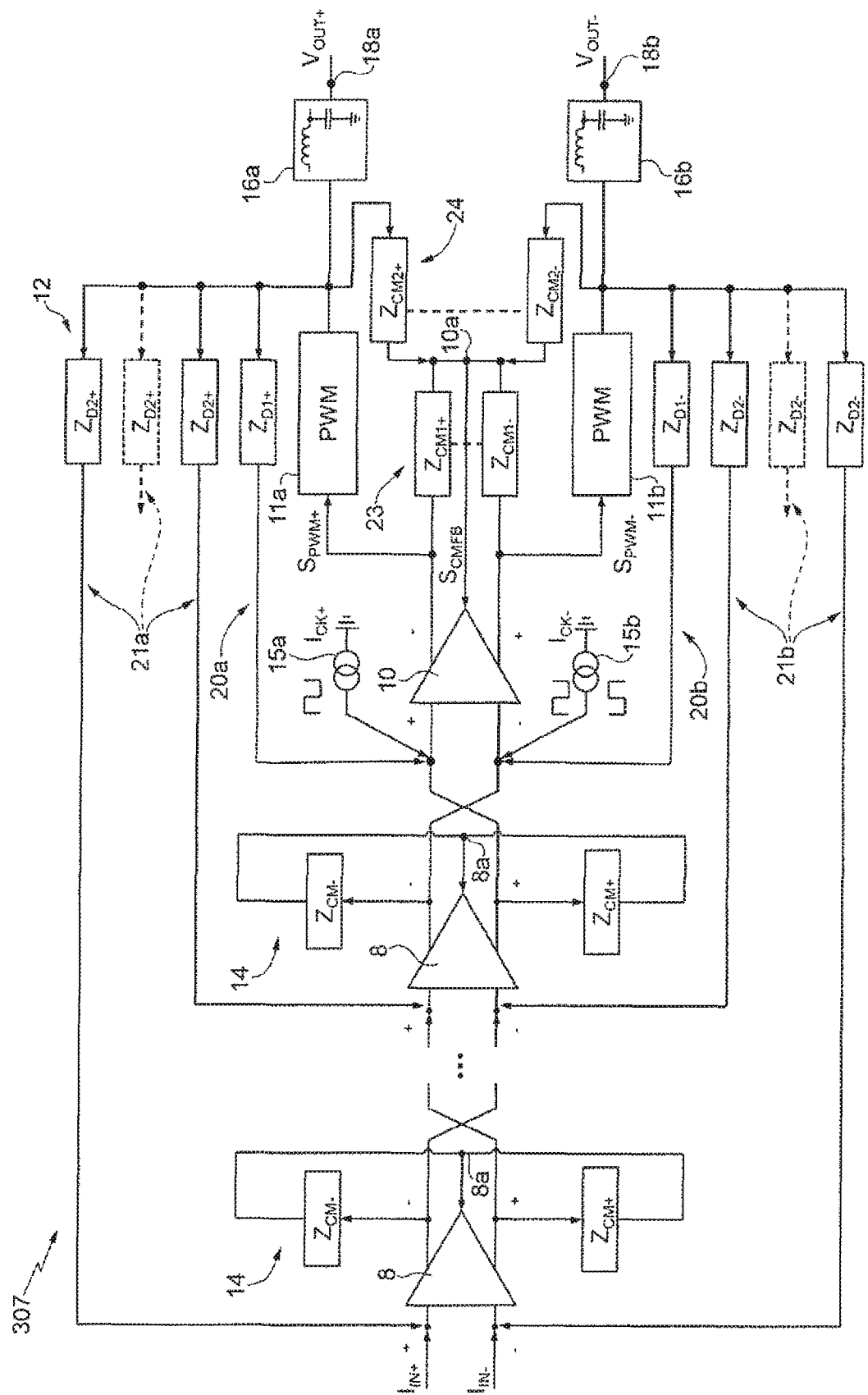
FIG. 9 is a block diagram of the switching amplifier according to another embodiment of the present invention.

FIG. 9 shows a further embodiment. In this case, in an audio amplifier 307 the outer control loop 25 is missing and common-mode control of the PWM driving stage 10 is entrusted to the inner control loop 24 in ordinary operating conditions and to the clipping control loop 23 in conditions of clipping of the first PWM modulator 11a and/or of the second PWM modulator 11b. Furthermore, as for the inner control loop 24, also the differential feedback-control network 12 may pick up the feedback signals at output from the PWM modulators 11a, 11b upstream of the output filters 16a, 16b.

Finally, it is evident that modifications and variations may be made to the amplifier and to the method described herein, without thereby departing from the scope of the present invention, as defined in the annexed claims.

What is claimed is:

1. A Class-D amplifier comprising:
   a first fully-differential amplifier having differential inputs configured to receive an input signal;
   a PWM control stage coupled to the first fully-differential amplifier and having a common-mode input, wherein the PWM control stage comprises a low-pass filter coupled between the common-mode input of the PWM control stage and a first output of the PWM control stage;
   a first half-bridge coupled between the PWM control stage and a first output node; and
   a second half-bridge coupled between the PWM control stage and a second output node, wherein
      the PWM control stage is configured to control the first half-bridge and the second half-bridge,
      an input of the first half-bridge is coupled to the common-mode input of the PWM control stage via a first impedance,
      an input of the second half-bridge is coupled to the common-mode input of the PWM control stage via a second impedance,
      the first output node is coupled to the common-mode input of the PWM control stage via a third impedance, and
      the second output node is coupled to the common-mode input of the PWM control stage via a fourth impedance.

2. The Class-D amplifier of claim 1, further comprising a second fully-differential amplifier coupled between the first fully-differential amplifier and the PWM control stage.

3. The Class-D amplifier of claim 1, further comprising:
   a first output filter coupled to the first output node;
   a second output filter coupled to the second output node; and
   a load coupled between the first output filter and the second output filter.

4. The Class-D amplifier of claim 3, wherein
   a first terminal of the load is coupled to the common-mode input of the PWM control stage via a fifth impedance; and
   a second terminal of the load is coupled to the common-mode input of the PWM control stage via a sixth impedance.

5. The Class-D amplifier of claim 1, wherein the PWM control stage further comprises:
   a first control amplifier coupled to the first output of the PWM control stage;
   a second control amplifier coupled to a second output of the PWM control stage; and
   an error amplifier coupled between the low-pass filter and the first and second control amplifiers.

6. The Class-D amplifier of claim 1, further comprising:
   a first comparator coupled between the PWM control stage and the first half-bridge;
   a second comparator coupled between the PWM control stage and the second half-bridge; and
   a reference generator coupled to the first and second comparator.

7. The Class-D amplifier of claim 6, wherein the reference generator is configured to generate a triangular signal.

8. The Class-D amplifier of claim 1, further comprising:
   a first switch coupled between the input of the first half-bridge and the first impedance;
   a second switch coupled between the input of the second half-bridge and the second impedance; and
   a clipping detector coupled to the first switch and the second switch.

9. The Class-D amplifier of claim 8, wherein the clipping detector is configured to turn on the first switch and the second switch when a clipping event occurs.

10. A method of controlling a Class-D amplifier, the method comprising:
    receiving an input signal with a first fully-differential amplifier;
    generating a first and second PWM signals with a PWM control stage based on differential outputs of the fully differential amplifier;
    controlling a first half-bridge with the first PWM signal;
    controlling a second half-bridge with the second PWM signal; and
    setting a common-mode of the PWM control stage based on a feedback node, wherein the setting the common-mode of the PWM control stage comprises
       receiving the first PWM signal at the feedback node via a first impedance,
       receiving the second PWM signal at the feedback node via a second impedance,
       receiving a first signal from an output of the first half-bridge at the feedback node via a third impedance,
       receiving a second signal from an output of the second half-bridge at the feedback node via a fourth impedance, and
       low-pass filtering a signal from the feedback node with a low-pass filter.

11. The method of claim 10, wherein the setting the common-mode of the PWM control stage further comprises:
    receiving a third signal from a first output filter coupled to the first half-bridge at the feedback node via a fifth impedance; and
    receiving a fourth signal from a second output filter coupled to the second half-bridge at the feedback node via a sixth impedance.

12. The method of claim 10, wherein the first PWM signal and the second PWM signal correspond to an in-phase modulation scheme.

13. The method of claim 10, wherein the first PWM signal and the second PWM signal correspond to an out-of-phase modulation scheme.

14. The method of claim 10, wherein the low-pass filter has a cut-off frequency lower than a switching frequency of the first PWM signal.

15. The method of claim 10, further comprising:
    detecting a clipping event;
    closing a first switch coupled between a first output of the PWM control stage and the first impedance after detecting the clipping event; and
    closing a second switch coupled between a second output of the PWM control stage and the second impedance after detecting the clipping event.

16. The method of claim 15, wherein detecting the clipping event comprises:
    determining that the output of the first half-bridge has a 100% duty cycle; or determining that the output of the second half-bridge has a 100% duty cycle.

17. The method of claim 15, further comprising opening the first and second switches during an absence of the clipping event.

18. A Class-D audio amplifier comprising:
a first fully-differential amplifier stage configured to receive an audio signal;
a fully-differential PWM control stage comprising
differential inputs coupled to differential outputs of the first fully-differential amplifier, and
a low-pass filter coupled between a common-mode input of the fully-differential PWM control stage and a first and second differential outputs of the fully-differential PWM control stage;
a first half-bridge coupled between the first differential output of the fully-differential PWM control stage and a first output node; and
a second half-bridge coupled between the second differential output of the fully-differential PWM control stage and a second output node, wherein
the first differential output of the fully-differential PWM control stage is coupled to the common-mode input of the fully-differential PWM control stage via a first impedance,
the second differential output of the fully-differential PWM control stage is coupled to the common-mode input of the fully-differential PWM control stage via a second impedance,
the first output node is coupled to the common-mode input of the fully-differential PWM control stage via a third impedance, and
the second output node is coupled to the common-mode input of the fully-differential PWM control stage via a fourth impedance.

19. The Class-D audio amplifier of claim 18, further comprising:
a first output filter coupled to the first output node;
a second output filter coupled to the second output node; and
a loudspeaker coupled between the first output filter and the second output filter.

20. The Class-D audio amplifier of claim 19, wherein
a first terminal of the loudspeaker is coupled to the common-mode input of the fully-differential PWM control stage via a fifth impedance; and
a second terminal of the loudspeaker is coupled to the common-mode input of the fully-differential PWM control stage via a sixth impedance.

* * * * *